United States Patent [19]
Nakane et al.

[11] 4,401,745
[45] Aug. 30, 1983

[54] COMPOSITION AND PROCESS FOR ULTRA-FINE PATTERN FORMATION

[75] Inventors: Hisashi Nakane, Kawasaki; Wataru Kanai, Samukawa; Minoru Tsuda, Isehara, all of Japan

[73] Assignee: Tokyo Ohka Kogyo Co., Ltd., Kawasaki, Japan

[21] Appl. No.: 296,358

[22] Filed: Aug. 26, 1981

[30] Foreign Application Priority Data

Aug. 29, 1980 [JP] Japan .............................. 55-118398

[51] Int. Cl.³ .............................................. G03C 1/52
[52] U.S. Cl. .................................. 430/197; 430/296; 430/313; 430/323; 430/919; 430/927; 156/643
[58] Field of Search ............ 430/197, 195, 919, 927, 430/313, 296, 323; 156/643

[56] References Cited

U.S. PATENT DOCUMENTS

| | | | |
|---|---|---|---|
| 3,752,671 | 8/1973 | Singh | 430/197 |
| 3,850,646 | 11/1974 | Wagner et al. | 430/197 |
| 3,950,173 | 4/1976 | Ross et al. | 430/296 |
| 4,018,937 | 4/1977 | Levine et al. | 430/296 |
| 4,232,110 | 11/1980 | Taylor | 156/643 |
| 4,241,165 | 12/1980 | Hughes et al. | 430/313 |
| 4,278,753 | 7/1981 | Lewis et al. | 430/283 |
| 4,287,294 | 9/1981 | Rubner et al. | 430/197 |

FOREIGN PATENT DOCUMENTS 2726813 12/1977 Fed. Rep. of Germany .
52-155531 12/1977 Japan .
54-27369 3/1979 Japan .
54-49072 4/1979 Japan .

OTHER PUBLICATIONS

Taylor, X-ray Resist Materials, Solid State Technology, vol. 23, pp. 73-80, May 1980.

*Primary Examiner*—J. Travis Brown
*Attorney, Agent, or Firm*—Armstrong, Nikaido, Marmelstein & Kubovcik

[57] ABSTRACT

A composition for ultra-fine pattern formation comprising at least one of acrylic and/or vinyl ketone polymers as the major component and an effective amount of an aromatic azide compound and, in another embodiment, further comprising an effective amount of an organic compound having a vinyl group, and a process for ultra-fine pattern formation therewith. In the process, a required area of a film formed from the composition is irradiated with a corpuscular beam or with electromagnetic wave radiation. The aromatic azide compound or a mixture thereof with the aromatic compound having a vinyl group only in the unexposed areas is subjected to a deactivation treatment within the film, and the unexposed areas of the film are removed with a gas plasma to form an ultra-fine pattern. The composition is suitable for use in the ultra-fine pattern formation of a resist for transistors, integrated circuits (IC), large scale integrated circuits (LSI) or the like in the semiconductor industry.

21 Claims, No Drawings

COMPOSITION AND PROCESS FOR ULTRA-FINE PATTERN FORMATION

BACKGROUND OF THE INVENTION

1. Field of the Invention

This invention relates to a composition for ultra-fine pattern formation of a resist for transistors, integrated circuits (IC), large scale integrated circuits (LSI) or the like in the semiconductor industry, and to a process for the ultra-fine pattern formation therewith and, more particularly, relates to a composition for ultra-fine pattern formation which comprises a major amount of an acrylic and/or vinyl ketone polymer and an effective amount of a specified aromatic compound, and a process for ultra-fine pattern formation which comprises coating the composition on a substrate and irradiating with a corpuscular beam or an electromagnetic wave to pattern the resulting film.

2. Description of the Prior Art

The production of electronic devices in the semiconductor industry requires a number of processing steps, including photolithography. The currently used photolithography includes processing by irradiation with ultraviolet light and requires light exposure techniques and a photosensitive material adaptable for processing, that is, a photoresist. In conventional photolithography, a thin layer of a material to be etched, such as silicon oxide, silicon nitride or polysilicon having a thickness on the order of thousands of angstroms is formed on a silicon wafer, a resist film is coated thereon, the resulting film is irradiated with ultraviolet light through a predetermined photomask, and is then subjected to conventional wet development and rinsing. Etching of the silicon oxide layer or the like is effected, the photoresist is removed, the wafer is rinsed well and dried, and an impurity is allowed to diffuse through the exposed area of silicon to be implanted thereinto. Semiconductor devices are manufactured by repeating the above photolithography several times, followed by the preparation of electrodes and wirings.

The conventionally used photoresist in the semiconductor industry includes a negative photoresist which is crosslinked for insolubilization by irradiation with ultraviolet light or the like, and a positive photoresist which is decomposed for dissolution by irradiation. Among the light or corpuscular beam sensitive photoresists, the negative photoresist is such that unexposed areas are selectively dissolved for removal with an organic solvent or an alkali solution, which is termed a "developer", and the positive photoresist is such that exposed areas are selectively dissolved for removal therewith, respectively, to obtain an ultra-fine pattern as required. Examples of the negative photoresist currently used include OMR marketed by Tokyo Ohka Kogyo Co., KMR marketed by Eastman Kodak Co., Waycoat marketed by Hunt Chemical Corp., and the like. Examples of the positive photoresist currently used include OFPR marketed by Tokyo Ohka Kogyo Co., AZ marketed by Shipley Co., KMPR marketed by Eastman Kodak Co., HPR marketed by Hunt Chemical Corp., and the like. An example of an electron beam radiation sensitive resist is OEBR marketed by Tokyo Ohka Kogyo Co. and an example of a deep-ultraviolet light sensitive resist is ODUR marketed by Tokyo Ohka Kogyo Co.

After irradiation with the active light, all of the aforesaid photoresists are subjected to development and rinsing by a wet process using an organic solvent or alkali solution. A resist image thus obtained is used as a mask for etching of the substrate with a fluoric acid (e.g., hydrofluoric acid) etching solution. Dry etching of the surface of a substrate with a plasma prepared from a reactive gas such as $CF_4$ gas, $CF_4$-$O_2$ mixed gas, $CCl_4$ gas, $CCl_4$-Ar mixed gas, $CCl_4$-He mixed gas or the like is becoming widely available. After etching, the resist image is usually removed with a stripping solution of an organic solvent. Ashing for dry removal of the resist, as well as dry cleaning of the substrate by exposing the wafer to an oxygen gas plasma, is known. Development, however, is still being effected according to the conventional wet process described above.

In the conventional wet process of development and rinsing, the organic solvent swelling of the resist and penetrating of the solvent between the resist layer and the substrate are considered to be one of the reasons for reduction in dimensional reproducibility of the resist image, which results in reduction in processing precision, reduction in productivity and the like. The use of such organic solvent and alkali solution is associated with such problems as worsening the working atmosphere, reduction in safety for operators, requirements for the waste liquor treatment, extension of the operating time, complexity and difficulty for automation, development of environmental pollution and the like. Moreover, the worldwide price increase for petroleum resources results in price increase for all kinds of petroleum products, including organic solvents used for conventional lithography. Thus, the use of such solvent presents a serious economic problem.

SUMMARY OF THE INVENTION

An object of this invention is to provide a composition for ultra-fine pattern formation, said composition comprising a major amount of an acrylic and/or vinyl ketone polymer and an effective amount of a specified aromatic compound.

Another object of this invention is to provide a composition for ultra-fine pattern formation which is dry developable because of differences in the degree of ashing between areas which have to be exposed to an active radiation and unexposed areas.

Another object of this invention is to provide a process for ultra-fine pattern formation which is capable of effecting dry development of a resist by use of a novel dry developable composition and makes possible the dry processing and automation of a series of lithography steps, and the consequent automation of a series of steps for the manufacture of semiconductor devices.

That is to say, this invention provides: (1) a composition for ultra-fine pattern formation comprising a major amount of at least one of acrylic and/or vinyl ketone polymers and an effective amount of an azide compound, or further comprising an effective amount of an organic compound having a vinyl group; and (2) a process for ultra-fine pattern formation therewith. The process comprises irradiating a required area of a film formed from the composition with a corpuscular beam or an electromagnetic wave radiation, subjecting the aromatic azide compound or a mixture thereof with the aromatic compound having a vinyl group only in the unexposed areas to a deactivated treatment within the film, and selectively removing the unexposed area of the film under a gas plasma.

Detailed Description of the Invention

Polymers used in the present invention have no aromatic nucleus on the main chains and side chains thereof, are readily ashed for removal under a gas plasma, are nonviscous when dried, and are preferred to be an acrylic and/or a vinyl ketone polymer. Examples of the aforesaid polymers include polymethyl methacrylate, polymethylisopropenyl ketone, polyglycidyl methacrylate, a copolymer of glycidyl methacrylate and methyl methacrylate, polyvinyl chloride, polyvinyl acetate, a copolymer of vinyl chloride and vinyl acetate, a copolymer of vinyl cloride and acrylic acid, polyisopropyl vinyl ketone, polybutyl methacrylate, poly-2-chloro-ethyl acrylate and the like.

The molecular weight of the aforesaid polymers is preferably in the range of from tens of thousands to two million, more preferably, one-hundred and several tens of thousands to one million. When the molecular weight is greater than the upper limit, the polymer in a coating solution scattered on coating with a spinner deposits in a floss shape adhering to the film. When the molecular weight is less than the aforesaid lower limit, the plasma resistance of the polymer cured with an active radiation becomes poor.

Examples of the aromatic azide compound used in the composition of the present invention include the compounds represented by the following general formulas:

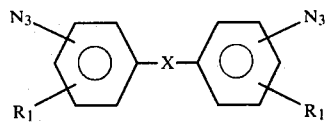
(i)

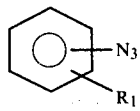
(ii)

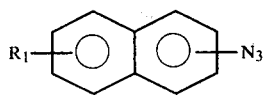
(iii)

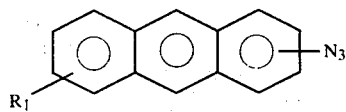
(iv)

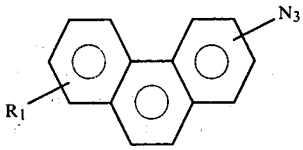
(v)

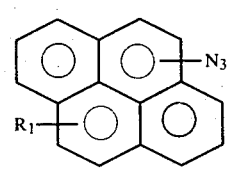
(vi)

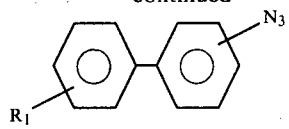
(vii)

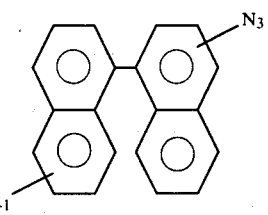
(viii)

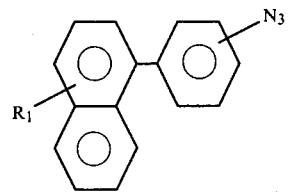
(ix)

where X represents: —O—, —CO—, —CH$_2$—, —S—, —SO$_2$—, —CH=CH—, —CH=CH—CO—CH=CH—, —CH=CH—CO—,

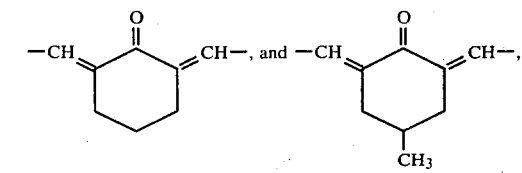

and R$_1$ represents a hydrogen atom, a halogen atom, an azide group, a lower alkyl group and a halogenated lower alkyl group.

Specific examples of the aromatic azide compound include 4,4'-diazidodiphenyl ether, 4,4'-diazidodiphenyl methane, 4,4'-diazidodiphenyl sulfide, 4,4'-diazidodiphenyl sulfone, 2,2'-diazidostilbene, 4,4'-diazido-dibenzylidene acetone, 1-azidonaphthalene, 1-azidoanthracene, 1-azidophenanthrene, 1-azidopyrene, 2,6-di-(4'-azidobenzal)-4-methylcyclohexanone, 2,6-di-(4'-azidobenzal)-cyclo-hexanone, 4,4'-diazidochalcone, 4,4'-diazidobenzal acetone, 4,4'-diazido-benzophenone, 4,4'-diazidobiphenyl, 3,3'-dimethyl-4,4'-diazidobiphenyl and the like.

With the composition comprising the aforesaid polymer and the aforesaid aromatic azide compound, the object of the present invention may be achieved, but further addition thereto of an aromatic compound having a vinyl group makes it possible to reduce the amount of the aromatic azide compound to be used. Compatibility of the aforesaid polymer with the aromatic azide compound has such a limit that the aromatic azide compound should not be incorporated into the polymer above a certain level. Too much of the aromatic azide compound makes it impossible to obtain an ultra-fine pattern because the aromatic azide compound is crystallized and deposits in the photosensitive solution or on the film. With respect to conventional ultra-violet curing resin compositions comprising the polymer and the aromatic azide compound, the aromatic azide compound is added in an amount near the allowable upper limit relative to the particular polymer used in order to enhance the photosensitivity. Further addition of the aromatic compound having a vinyl group to a combination of the polymer and the aromatic azide compound makes it possible, not only to reduce the amount of the aromatic azide compound to be added, but also to further enhance the active radiation sensitivity.

Examples of the aromatic compound having a vinyl group include, preferably, the compounds represented by the following general formulas:

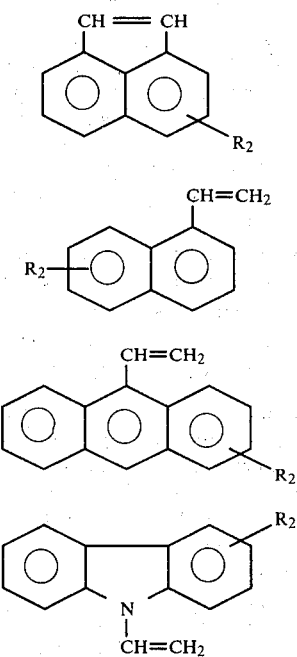

where $R_2$ represents a hydrogen atom, a halogen atom, a lower alkyl group and a halogenated lower alkyl group.

Specific examples of the aromatic compound having a vinyl group include acenaphthylene, 9-vinyl anthracene, 2-vinyl naphthalene, N-vinyl carbazole and the like.

In the case where the aromatic compound having a vinyl group is not added, the amount of the aromatic azide compound used in the composition of the present invention is generally in the range of from 5 to 30% by weight, preferably 15 to 25% by weight based on the amount of the polymer. When the aforesaid amount of aromatic azide compound is more than 30% by weight, the aromatic azide compound is unfavorably crystallized and deposits in the coating solution or on the surface of the film coated on the wafer, making it impossible to obtain an ultra-fine pattern. When the aforesaid amount of aromatic azide compound is less than 5% by weight, the active radiation sensitivity thereof is so low that difference in degree of ashing between the exposed area and the unexposed area under a gas plasma is too small to be of practical use, thereby making it impossible to achieve plasma resistance in the exposed areas.

In the case where the aromatic compound having a vinyl group is added, the required amount of the aromatic azide compound is generally in the range of from 1 to 30% by weight, preferably 3 to 15% by weight based on the weight of the polymer and the amount of the aromatic compound having a vinyl group used is generally in the range of from 5 to 50% by weight, preferably 10 to 30% by weight based on the weight of the polymer. When more than the above-listed respective upper limits of either the aromatic azide compound or the aromatic compound having a vinyl group is used, such compound is crystallized to deposit in the coating solution or on the surface of the film coated on the wafer, thereby making it impossible to obtain an ultra-fine pattern. When less than the above-mentioned respective lower limits are used, the active radiation sensitivity of the resulting composition is so low that difference in degree of ashing between the exposed area and the unexposed area under a gas plasma is too small to be of practical use, thereby making it impossible to achieve plasma resistance in the exposed area.

In the process for ultra-fine pattern formation of the present invention, the aforesaid composition for ultra-fine pattern formation (i.e., the composition comprising an acrylic and/or a vinyl ketone polymer and an aromatic azide compound or, further, comprising an aromatic compound having a vinyl group) is dissolved in a suitable solvent to prepare a coating solution.

Examples of the aforesaid solvent include cyclohexanone, 2-hexanone, methyl cellosolve acetate, ethyl cellosolve acetate, toluene, xylene, 2-nitropropane and the like, and mixtures thereof.

The amount of such solvent used is generally in the range of from 3 to 100 parts by weight, preferably 5 to 20 parts by weight per 1 part by weight of the polymer.

The coating solution thus obtained is spincoated onto a substrate such as a wafer with a spinner at a speed (revolutions per minute) to form a film having a predetermined thickness, and the coated substrate is placed in an oven for a period of from 15 to 30 minutes to evaporate and remove the residual organic solvent used, and to obtain a solid resist film. Thereafter, said resist film is irradiated with an active radiation such as a corpuscular beam, electromagnetic wave radiation or the like through a suitable mask for patterning. When an electron beam radiation is used as the corpuscular beam, patterning is effected by scanning of the electron beam radiation. When the active radiation is other than an electron beam radiation, irradiation for patterning is performed through a mask. The aromatic azide compound and/or aromatic compound having a vinyl group in the exposed area is activated by irradiation and reacts with the polymer in the resist to change physical properties of the polymer by crosslinking, pendanting, grafting, etc., that is, to improve plasma resistance of the polymer. The polymer in the unexposed area remains unchanged. It is subjected to deactivation treatment, such as removal from the resist or deactivation by heating, vacuum treatment or a combination thereof and is then placed in a plasma reaction chamber. The aforesaid deactivation treatment may be effected in the gas plasma reaction chamber. Thus, difference is plasma resistance between the exposed area and the unexposed area becomes so remarkable that the unexposed area is readily ashed and selectively removed, while the thickness of the exposed area of the film is only slightly reduced even when placed in the plasma atmosphere so that an ultra-fine pattern can be formed on the substrate.

Examples of effective irradiation sources used in the present invention include corpuscular beam, such as electron beam radiation, and electromagnetic wave radiation such as X-ray, ultra-violet light and deep-ultra-violet light.

Examples of the gas introduced for development preferably include $O_2$ gas, $CF_4$ gas, $CF_4$-$O_2$ mixed gas, $O_2$-Ar mixed gas and the like.

With the composition for the ultra-fine pattern formation of the present invention, differences in degree of ashing between areas which have been exposed to activate radiation and those which have not been so exposed make it possible to develop a predetermined pattern by dry processing, thereby to render unnecessary the use of the organic solvents and alkali solutions, as well as the rinsing step of conventional wet development. Thus, with the instant process: (1) neither swelling of the resist nor penetrating of the solvent takes place, thereby resulting in excellent dimensional stability and processing precision; (2) high resolution can be obtained; (3) pollution of the working atmosphere because of the use of organic solvents and alkali solution is avoided and safety of operation is improved; (4) no waste liquor treatment is required, thereby eliminating a source of pollution; (5) automation of the development step is made possible; and (6) the use of expensive treating reagents is unnecessary, thereby to provide an economically attractive process for forming an ultra-fine pattern.

After completion of the dry development processing, the substrate can be subjected to plasma etching by replacing the gas in the plasma generator with other gases for etching. Further replacement thereof by oxygen gas or the like for treatment makes it possible to remove the resist forming the ultra-fine pattern by ashing and stripping said resist. This makes it possible to automate a series of steps in the manufacture of a semiconductor device.

The present invention will be further illustrated and described by the following examples, which are not to be construed as limiting.

EXAMPLE 1

5 g of polyisopropenyl ketone having a molecular weight of 180,000 and one gram of 1-azidopyrene are dissolved in about 50 g of cyclohexanone to obtain a photosensitive solution. The photosensitive solution is spincoated onto a silicon wafer having a thermally oxidized layer thereon at a rotation of 3,000 rpm for 30 seconds. Thereafter, the coated wafer is placed in an oven at 85° C. for drying for 20 minutes to evaporate the residual organic solvent, and 15 counts of deep-ultra-violet light having a wavelength of from 250 to 300 nm is contact-irradiated with a deep UV (ultra-violet) Mask Aligner PLA-520F fitted with a CM-250 cold mirror (marketed by Canon Inc.) on the resulting coated and dried wafer through a resolution capability test mask having a pattern of 0.5 μm in a minimum width, where one count is equal to the amount of energy produced by irradiating with a super high pressure mercury lamp having a 500 W power for 0.85 second. The wafer thus obtained is then subjected to post-baking in an oven kept at 130° C. and drawn to a vacuum of less than 6 mmHg for 30 minutes.

Thereafter, the resulting post-baked wafer is placed in a plasma processing apparatus (marketed by Tokyo Ohka Kogyo Co., product name OAPM-301B) and subjected to plasma development in an atmosphere of oxygen plasma under the conditions of an RF power (radio frequency) of 100 W, at a radio frequency of 13.56 MHz, a pressure of 1.0 Torr, an oxygen flow rate of about 100 ml/min and a wafer table temperature of 100° C., either for about one minute when parallel plate type electrodes are employed, or for about 3 minutes when coaxial type electrodes are employed, wth the result that an image having a resolution of 0.5 μm is obtained. After the completion of the plasma development stage, the plasma gas (oxygen) is replaced for etching the substrate. A mixed gas of $CF_4$ gas and $O_2$ gas at a ratio of 95:5 by volume is used for etching silicon dioxide as the substrate. Etching is effected for 3 minutes under conditions wherein 200 W power is used, and the temperature of the wafer table, on which the wafer is placed, is 100° C. and the gas pressure in the reaction chamber is 0.3 Torr.

Etching by using a resist pattern resulting from dry development by the procedures described as above as a mask enables the substrate to be etched with high precision.

After the completion of etching, a mixed gas of $CF_4$ gas and $O_2$ gas at a ratio of 95:5 by volume is replaced by oxygen to effect plasma treatment under the conditions of a 200 W power, a wafer table temperature of 100° C. and an oxygen gas flow rate of 250 ml/min so that the photoresist may be removed in about one and one-half minutes.

EXAMPLE 2

The procedures in EXAMPLE 1 are repeated, except that a photosensitive solution is prepared from 5 g of polymethyl methacrylate having a molecular weight of 600,000, one gram of 1-azidonaphthalene, and about 50 g of ethyl cellosolve acetate, resulting in obtaining an image having a resolution of 1 μm.

After completion of the plasma development stage, the oxygen plasma gas is replaced by a mixed gas of $CF_4$ gas and $O_2$ gas at a ratio of 95:5 by volume for dry etching under the conditions of an RF power of 150 W, a wafer table temperature of 100° C., and a gas pressure of 0.3 Torr for 3 minutes. This treatment produces an etching pattern faithful to the resist pattern. After completion of the etching, the mixed gas is replaced by oxygen to remove the photoresist in the same manner as in EXAMPLE 1.

EXAMPLE 3

A photosensitive solution is prepared from 8 g of polyisopropenyl ketone having a molecular weight of 180,000, 2 g of N-vinyl carbazole, 0.5 g of 4,4'-diazidodiphenyl ether and about 80 g of cyclohexanone in the same manner as in EXAMPLE 1. The photosensitive solution is spincoated at a rotation of 3000 rpm for 40 seconds onto a 3-inch silicon wafer coated thereon with a polysilicon layer having a thickness of 4000 Å. The coated wafer is placed in an oven kept at 70° C. for effecting prebaking in the air for 20 minutes to evaporate the residual organic solvent, and 20 counts of deep-ultra-violet light having a wavelength of from 250 to 300 nm is irradiated with a deep UV Mask Aligner PLA-520F fitted with CM-250 cold mirror (marketed by Canon Inc.) on the resulting wafer through a quartz mask as in EXAMPLE 1. The wafer thus produced is then subjected to post-baking in a vacuum oven kept at 140° C. and drawn to a vacuum of less than 6 mmHg for 30 minutes.

Thereafter, the resulting post-baked wafer is placed in a plasma processing apparatus OAPM-301B as in EXAMPLE 1 and is subjected to plasma development under the conditions of an RF power of 150 W, a wafer table temperature of 100° C. and an oxygen pressure of 1.2 Torr for one minute to obtain a resist pattern having a minimum width of 0.5 μm on the surface of the wafer.

After completion of plasma development, the oxygen plasma gas is replaced by a mixed gas of CF₄ gas and O₂ gas at a ratio of 95:5 by volume to effect dry etching of the polysilicon by use of the resist pattern obtained as above as a mask under the conditions of an RF power of 150 W, a gas pressure of 0.35 Torr and a wafer table temperature of 100° for 4 minutes, with the result that etching of the polysilicon is effected faithfully to the resist pattern.

After the completion of etching, the aforesaid etching gas is replaced by oxygen gas to effect plasma processing for 4 minutes and to remove the resist.

EXAMPLE 4

Procedures of EXAMPLE 1 are repeated except that a photosensitive solution is prepared from 8 g of polyisopropenyl ketone having a molecular weight of 180,000, 2 g of acenaphthylene, 0.5 g of 4,4'-diazidodiphenyl methane and about 80 g of cyclohexanone with the result that an image having a resolution of 1.5 μm is obtained.

EXAMPLE 5

Procedures of EXAMPLE 1 are repeated except that a photosensitive solution is prepared from 8 g of polyglycidyl methacrylate, 2 g of 2-vinyl naphthalene, 0.5 g of 4,4'-diazidodiphenyl ether, and about 70 g of ethyl cellosolve acetate, with the result that an image having a resolution of 0.5 μm is obtained.

EXAMPLE 6

Procedures of EXAMPLE 1 are repeated except that a photosensitive solution is prepared from 5 g of polymethyl methacrylate having a molecular weight of 600,000, one gram of 1-azidopyrene, and about 50 g of toluene with the result that an image having a resolution of 1 μm is obtained.

EXAMPLE 7

Procedures of EXAMPLE 1 are repeated, except that a photosensitive solution is prepared from 8 g of polymethyl methacrylate having a molecular weight of 600,000, 0.5 g of 1-azidopyrene, 2 g of 2-vinyl naphthalene and about 100 g of toluene with the result that an image having a resolution of 1 μm is obtained.

In comparison of the composition in EXAMPLE 7 with that of EXAMPLE 6, the composition in EXAMPLE 7 contains 2-vinyl naphthalene as the aromatic compound having a vinyl group, and contains 1-azidopyrene as the aromatic azide compound in such an amount that the ratio of the amount of the polymer to that of the aromatic azide compound is 16:1 by weight, while the composition in EXAMPLE 6 contains no aromatic compound having a vinyl group and contains 1-azidopyrene as the aromatic azide compound in such an amount that the weight ratio of the amount of the polymer to that of the aromatic azide compound is 5:1, with the result that the image obtained in EXAMPLE 7 has the same resolution as that in EXAMPLE 6.

The above result shows that addition of the aromatic compound having a vinyl group permits a great reduction in the amount of the aromatic azide compound used (based on the weight of the polymer) without adversely effecting resolution.

EXAMPLE 8

Procedures of EXAMPLE 1 are repeated, except that a photosensitive solution is prepared from 5 g of a copolymer of glycidyl methacrylate and methyl methacrylate having a molecular weight of 120,000, one gram of 1-azidonaphthalene, and about 50 g of cyclohexanone with the result that an image having a resolution of 1 μm is obtained.

EXAMPLE 9

Procedures of EXAMPLE 1 are repeated, except that a photosensitive solution is prepared from 5 g of a copolymer of vinyl chloride and vinyl acetate, one gram of 4,4'-diazidodibenzylidene acetone and about 50 g of toluene with the result that an image having a resolution of 1 μm is obtained.

EXAMPLE 10

Procedures of EXAMPLE 1 are repeated except that a photosensitive solution is prepared from 8 g of poly-2-chloroethylacrylate having a molecular weight of 320,000, 2 g of acenaphthylene, 0.5 g of 4,4'-diazidodiphenyl ether and about 80 g of toluene, with the result that an image having a resolution of 1 μm is obtained.

EXAMPLE 11

A photosensitive solution prepared by dissolving 5 g of polyisopropenyl ketone having a molecular weight of 210,000 and 1.5 g of 2,6-di-(4'-azidobenzal)-4-methylcyclohexanone in about 70 g of cyclohexanone is spin-coated onto a 3 inch silicon wafer having a thermally oxidized layer of about 4000 Å thereon at a rotation of 3000 rpm for 40 seconds. Thereafter, the coated wafer is dried in an oven at 85° C. for 20 minutes, and is contact irradiated with 15 seconds of ultra-violet light having a wave length of from 300 to 450 nm with a deep UV Mask Aligner PLA-300 (marketed by Canon Inc.) on the resulting wafer through a glass chromium mask having a pattern of 0.5 μm in a minimum width. The wafer thus obtained is heated in an oven kept at 140° for 30 seconds and then placed in a plasma processing apparatus OAPM-301B having parallel-plate type electrodes (marketed by Tokyo Ohka Kogyo Co.) for plasma development under the conditions of an RF power of 100 W, a radio frequency of 13.56 MHz, an oxygen pressure of 1.0 Torr, a wafer table temperature of 100° C., and a distance between electrodes of 30 mm.

The coated film as above has a thickness of 1 μm, and plasma development thereof is completed in about one minute and 30 seconds, obtaining a resolution of 0.5 μm.

After the completion of plasma development, the oxygen plasma gas is replaced by a mixed gas of CF₄ gas and O₂ gas at a ratio of 95:5 by volume for etching the silicon oxide layer for five minutes under the conditions of an RF power of 100 W, a wafer table temperature of 100° C., and a gas pressure of 0.6 Torr with the result that an etching pattern faithful to a resist pattern is obtained.

After the completion of etching, the aforesaid etching gas is replaced by oxygen gas to effect plasma processing under a gas pressure of 2 Torr for 5 minutes for removal of the coated film as above.

The same result as above can be obtained by use of 2,6-di-(4'-azidobenzal)-cyclohexanone, 4,4'-diazidochalcone, 4,4'-diazidobenzal acetone, and 4,4'-diazidobenzophenone instead of 2,6-di-(4'-azidobenzal)-4-methylcyclohexanone in the aforesaid photosensitive solution.

EXAMPLE 12

A coating solution for a resist formation is prepared from 8 g of polyglycidyl methacrylate having a molecular weight of 90,000, 2 g of acenaphthylene, one gram of 3,3'-dimethyl-4,4'-diazidobiphenyl and about 70 g of ethyl cellosolve acetate and coated onto a wafer. The coated wafer is dried in an oven kept at 85° C. for 20 minutes. The wafer thus obtained is irradiated with X-ray by use of X-ray tube AFX-51-RH and X-ray generator XC-401 (marketed by Tokyo Shibaura Electric Co., Ltd.) in an amount of 280 mJ/cm$^2$ under such conditions that an Rh target, a 0.7 kW–20 kV pumping, a beryllium window, and RH La 4.6 A line are used respectively, the distance between the wafer the the target is 12 cm, and the X-ray flux is 5.7 mJ/cm$^2$/min. The wafer thus obtained is then subjected to post-baking in a vacuum oven kept at 130° C. under a vacuum of less than 6 mmHg for 30 minutes, followed by being subjected to plasma processing in the same manner as in EXAMPLE 1 to obtain a negative image.

EXAMPLE 13

Photosensitive solutions used in EXAMPLES 1, 3, 4 and 9, respectively, are coated on 4 separate wafers, which are then dried. Each of the resulting dried wafers is spot-irradiated with an electron beam radiation by use of a scanning electron microscope HHS-2R (marketed by Hitachi, Ltd) under the conditions of an irradiation current of $5\times 10^{-10}$ μA (micron ampere), an irradiation intensity of $9.62\times 10^{-6}$ C/cm$^2$, and an irradiation time of 30 seconds. The resulting wafer is subjected to post-baking in an oven at 130° C. under a vacuum of less than 6 mmHg for 30 minutes. Thereafter, the post-baked wafer is subjected to plasma processing for development in the same manner as in EXAMPLE 1, with the result that an image having 140 μm of diameter is obtained.

EXAMPLE 14

A photosensitive solution is prepared from 5 g of polyisopropenyl ketone having a molecular weight of 180,000, one gram of 3,3'-dimethyl-4,4'-diazidobiphenyl, and about 50 g of cyclohexanone. The photosensitive solution is coated, dried, irradiated with an electron beam radiation and subjected to plasma development with the result that an image having 140 μm of diameter in width as in EXAMPLE 13 is obtained.

COMPARATIVE EXAMPLE 1

A coating solution for resist formation is prepared from 8 g of polyisopropenyl ketone having a molecular weight of 180,000, 2 g of acenaphthylene, and about 80 g of cyclohexanone. The coating solution is coated on a wafer and subjected to irradiation processing and to development with oxygen gas plasma with the result that no image is formed.

COMPARATIVE EXAMPLE 2

The procedures of EXAMPLE 11 are repeated, except that 2.5 g of 2,6-di-(4'-azidobenzal)-4-methylcyclohexanone is used with the result that crystals of 2,6-di-(4'-azidobenzal)-4: -methyl-cyclohexanone deposit on the surface of the coated film to be shown unfavorable for preparing an ultra-fine pattern.

On the other hand, in the case where 0.05 g of 2,6-di-(4'-azidobenzal)-4-methylcyclohexanone is used, no deposition thereof is formed. But the percent retention (%) of the resist thickness after development to the initial resist thickness is 5% and is found to be unable to stand the subsequent etching processing.

COMPARATIVE EXAMPLE 3

A photosensitive solution is prepared from 2 g of polymethylisopropenyl ketone, 8 g of N-vinyl carbazol, 0.5 g of 4,4'-diazidodiphenyl ether and about 50 g of cyclohexanone with the result that insoluble crystals of 4,4'-diazidodiphenyl ether deposit (i.e., precipitate).

As used herein, the term "an effective amount of an aromatic azide compound" or the term "an effective amount of an admixture of an aromatic azide compound and an aromatic compound having a vinyl group" means an amount of said azide compound or an amount of said admixture which, when present in the composition of the instant invention, reacts with the polymer component of said composition (which can be coated on a substrate and dried to form a solid film on the substrate) when exposed to active radiation to change physical properties of said polymer by crosslinking, pendant grafting, and the like to improve the plasma resistance of the polymer.

As used herein, the term "active radiation" means radiation which, when used to irradiate the composition of the instant invention (which can be coated on a substrate and dried to form a solid film on the substrate) causes the aromatic azide compound or the admixture of aromatic azide compound and aromatic compound having a vinyl group to react with the polymer component of said composition to change the physical properties of said polymer by crosslinking, pendant grafting and the like to improve the plasma resistance of said polymer.

What is claimed:

1. A composition for ultra-fine pattern formation comprising: (a) at least one polymer; and (b) an amount of an aromatic azide compound of from 5 to 30% by weight based on said polymer effective for reacting with said polymer to improve plasma resistance of said polymer when said composition is irradiated with an active radiation after being coated on a substrate and dried to form a solid film on the substrate, wherein said polymer is selected from the group consisting of polymethyl methacrylate, polymethylisopropenyl ketone, polyvinyl chloride, polyvinyl acetate, a copolymer of vinyl chloride and vinyl acetate, a copolymer of vinyl chloride and acrylic acid, polyisopropylvinyl ketone, polybutyl methacrylate and poly-2-chloroethyl acrylate, said polymer having a molecular weight in the range of from tens of thousands to two million; and wherein said aromatic azide compound is represented by the following formulas:

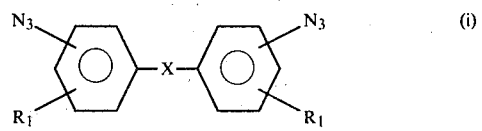

-continued

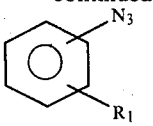 (ii)

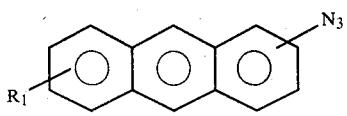 (iii)

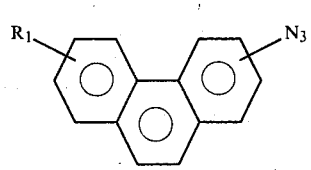 (iv)

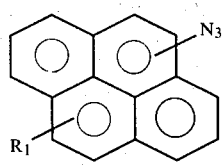 (v)

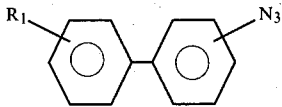 (vi)

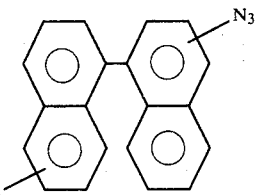 (vii)

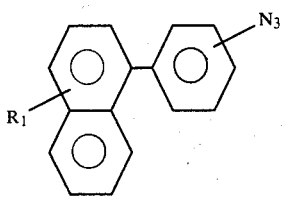 (viii)

where X represents —O—, —CO—, —CH$_2$—, —S—, —SO$_2$—, —CH=CH—, —CH=CH—CO—CH=CH—, —CH=CH—CO—,

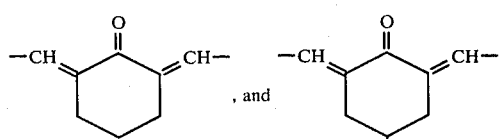

and R$_1$ represents hydrogen atom, a halogen atom, an azide group, a lower alkyl group or a halogenated lower alkyl group.

2. A composition for ultra-fine pattern formation comprising: (a) at least one polymer; and (b) an amount of an admixture of an aromatic azide compound and an aromatic compound having a vinyl group of from 1 to 30% by weight of said aromatic azide compound and of from 5 to 50% by weight of said aromatic compound having a vinyl group based on said polymer effective for reacting with said polymer to improve plasma resistance of the polymer when said composition is irradiated with an active radiation after being coated on a substrate and dried to form a solid film, wherein said polymer is selected from polymethyl methacrylate, polymethylisopropenyl ketone, polyvinyl chloride, polyvinyl acetate, a copolymer of vinyl chloride and vinyl acetate, a copolymer of vinyl chloride and acrylic acid, polyisopropylvinyl ketone, polybutyl methacrylate, and poly-2-chloroethyl acrylate, said polymer having a molecular weight in the range of from tens of thousands to two million; and wherein said aromatic azide compound is represented by the following formulas:

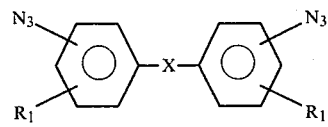 (i)

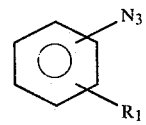 (ii)

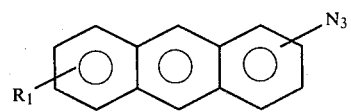 (iii)

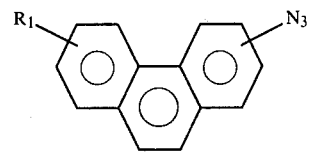 (iv)

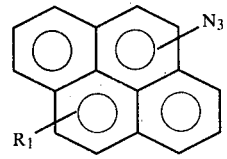 (v)

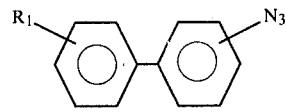 (vi)

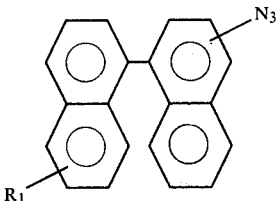 (vii)

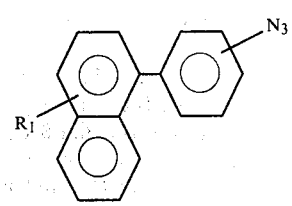 (viii)

where X represents —O—, —CO—, —CH$_2$—, —S—, —SO$_2$—, —CH=CH—, —CH=CH—CO—CH=CH—, —CH=CH—CO—,

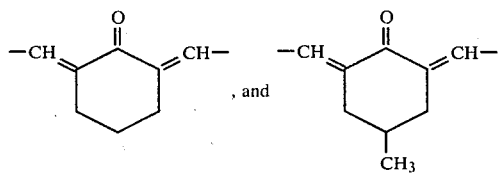, and and R$_1$ represents hydrogen atom, a halogen atom, an azide group, a lower alkyl group or a halogenated lower alkyl group.

3. A composition according to any one of claims 1 or 2 wherein said polymer has a molecular weight in the range of from one hundred and several tens of thousands to one million.

4. A composition according to claim 1 or 2 wherein said aromatic azide compound is selected from the group consisting of 4,4'-diazidodiphenyl ether, 4,4'-diazidodiphenylmethane, 4,4'-diazidodiphenyl sulfide, 4,4'-diazidodiphenyl sulfone, 2,2'-diazidostilbene, 4,4'-diazido-dibenzylidene acetone, 1-azidoanthracene, 1-azidophenanthrene, 1-azidopyrene, 2,6-di-(4'-azidobenzal)-4-methylcyclohexanone, 2,6-di-(4'-azidobenzal)-cyclohexanone, 4,4'-diazidobenzal acetone, 4,4'-diazidochalcone, 4,4-diazidobenzophenone, 4,4'-diazidobiphenyl and 3,3'-dimethyl-4,4'-diazidobiphenyl.

5. A composition according to claim 2 wherein said aromatic compound having a vinyl group is represented by the following general formulas:

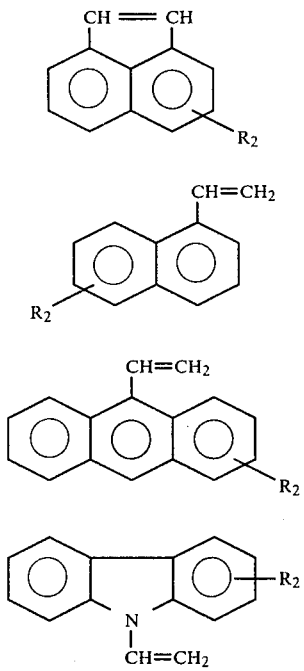

where R$_2$ is a hydrogen atom, a halogen atom, a lower alkyl group or a halogenated lower alkyl group.

6. A composition according to claim 5 wherein said aromatic compound having a vinyl group is selected from the group consisting of acenaphthylene, 9-vinyl anthracene, 2-vinyl naphthalene and N-vinyl carbazole.

7. A composition according to claim 1 wherein said aromatic azide compound is used in an amount of from 15 to 25% by weight based on said polymer.

8. A composition according to claim 2 wherein said aromatic azide compound is used in an amount of from 3 to 15% by weight and said aromatic compound having a vinyl group is used in an amount of from 10 to 30% by weight based on said polymer, respectively.

9. A process for ultra-fine pattern formation which comprises dissolving a composition comprising: (a) at least one polymer selected from the group consisting of polymethyl methacrylate, polymethylisopropenyl ketone, polyvinyl chloride, polyvinyl acetate, a copolymer of vinyl chloride and vinyl acetate, a copolymer of vinyl chloride and acrylic acid, polyisopropylvinyl ketone, polybutyl methacrylate and poly-2-chloroethyl acrylate, said polymer having a molecular weight in the range of from tens of thousands to two million; and (b) from 5 to 30% by weight based on said polymer of an aromatic azide compound in a solvent to form a coating solution, said azide compound being represented by the following formulas:

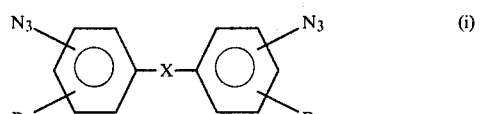 (i)

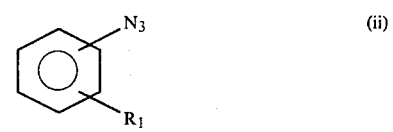 (ii)

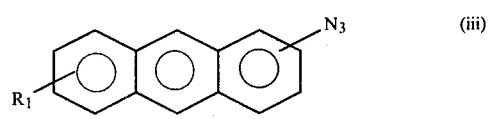 (iii)

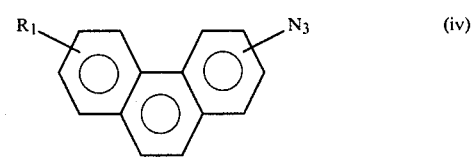 (iv)

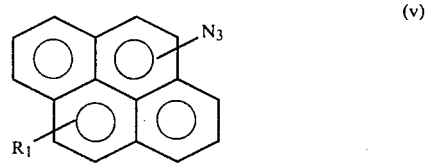 (v)

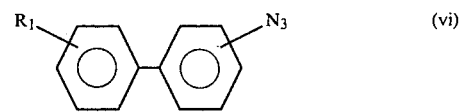 (vi)

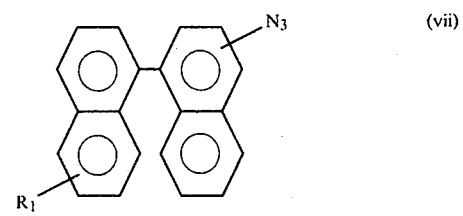 (vii)

-continued

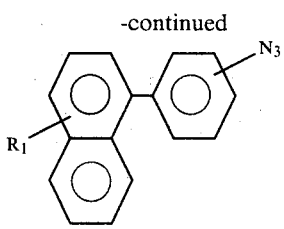

where X represents —O—, —CO—, —CH$_2$—, —S—, —SO$_2$—, —CH=CH—, —CH=CH—CO—CH=CH—, —CH=CH—CO—,

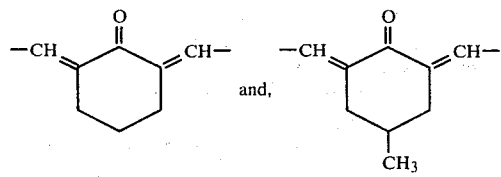

and R$_1$ represents hydrogen atom, a halogen atom, an azide group, a lower alkyl group or a halogenated lower alkyl group; coating said coating solution on a substrate; evaporating the solvent to form a solid film on the substrate; irradiating a predetermined area of said solid film which an active radiation, subjecting said aromatic azide compound in unexposed areas of the solid film to deactivation treatment and removing unexposed areas of the film under a gas plasma, the amount of said aromatic azide compound present in the solid film being that amount effective for reacting with said polymer to improve plasma resistance of said polymer when said solid film is irradiated with the active radiation.

10. A process for ultra-fine pattern formation which comprises dissolving a composition comprising: (a) at least one polymer selected from the group consisting of polymethyl methacrylate, polymethylisopropenyl ketone, polyvinyl chloride, polyvinyl acetate, a copolymer of vinyl chloride and vinyl acetate, a copolymer of vinyl chloride and acrylic acid, polyisopropylvinyl ketone, polybutyl methacrylate and poly-2-chloroethyl acrylate, said polymer having a molecular weight in the range of from tens of thousands to two million; and (b) an admixture of from 1 to 30% by weight based on the weight of said polymer of an aromatic azide compound and from 5 to 50% by weight based on the weight of said polymer of an aromatic compound having a vinyl group in a solvent for preparing a coating solution, said aromatic azide compound being represented by the following formulas:

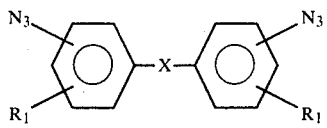

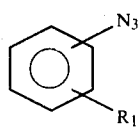

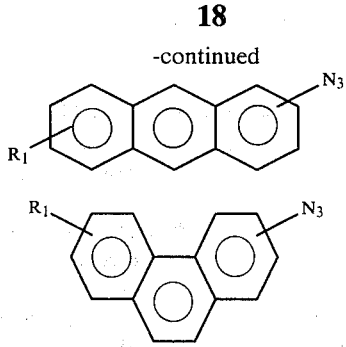

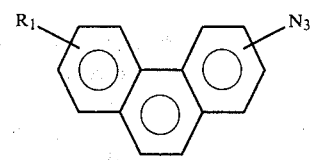

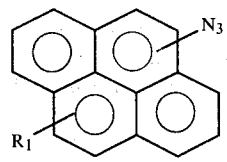

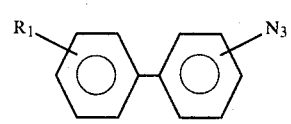

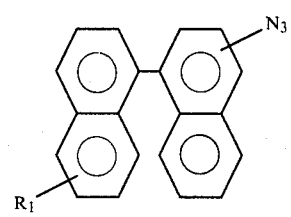

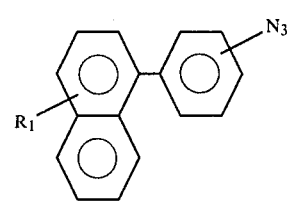

where X represents —O—, —CO—, —CH$_2$—, —S—, —SO$_2$—, —CH=CH—, —CH=CH—CO—CH=CH—, —CH=CH—CO—,

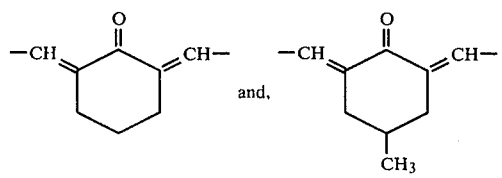

and R$_1$ represents hydrogen atom, a halogen atom, an azide group, a lower alkyl group or a halogenated lower alkyl group; coating said coating solution on a substrate, evaporating the solvent to form a solid film on the substrate; irradiating a predetermined area of said solid film with an active radiation; subjecting said admixture of said aromatic azide compound and said aromatic compound having a vinyl group in unexposed areas to deactivation treatment within the solid film; and removing unexposed areas of the film under a gas plasma; the amount of said aromatic azide compound and said aromatic compound having a vinyl group being an amount effective for reacting with said polymer in the solid film to improve plasma resistance of said polymer when said solid film is irradiated with the active radiation.

11. The process of claim 9 or claim 10 wherein said polymer has a molecular weight in the range of from one hundred and several tens of thousands to one million.

12. The process of claim 9 or claim 10 wherein said aromatic azide compound is selected from the group consisting of 4,4'-diazidodiphenyl ether, 4,4'-diazidodiphenyl methane, 4,4'-diazidodiphenyl sulfide, 4,4'-diazidodiphenyl sulfone, 2,2'-diazidostilbene, 4,4'-diazido-dibenzylidene acetone, 1-azidoanthracene, 1-azidophenanthrene, 1-azidopyrene, 2,6-di-(4'-azidobenzal)-4-methylcyclohexanone, 2,6-di-(4'-azidobenzal)-cyclohexanone, 4,4'-diazidobenzal acetone, 4,4'-diazidochalcone, 4,4-diazidobenzophenone, 4,4'-diazidobiphenyl and 3,3'-dimethyl-4,4'-diazidobiphenyl.

13. The process of claim 9 or claim 10 wherein said aromatic compound having a vinyl group is represented by the following general formulas:

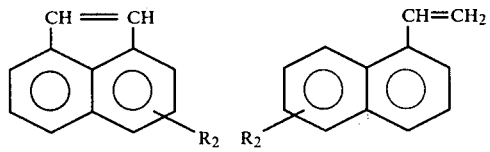

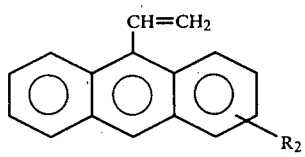

and

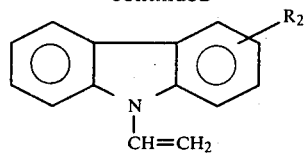

where $R_2$ is a hydrogen atom, a halogen atom, a lower alkyl group or a halogenated lower alkyl group.

14. The process of claim 9 or claim 10 wherein said aromatic compound having a vinyl group is selected from the group consisting of acenaphthylene, 9-vinyl anthracene, 2-vinyl naphthalene and N-vinyl carbazole.

15. The process of claim 9 wherein said aromatic azide compound is used in an amount of from 15 to 25% by weight based on said polymer.

16. The process of claim 10 wherein said aromatic azide compound is used in an amount of from 3 to 15% by weight and said aromatic compound having a vinyl group is used in an amount of from 10 to 30% by weight based on the weight of said polymer.

17. A process according to claim 9 or 10 wherein said active radiation is a corpuscular beam or an electromagnetic wave radiation.

18. A process according to claim 17 wherein said corpuscular beam is electron beam radiation.

19. A process according to claim 17 wherein said electromagnetic wave radiation is X-ray, ultraviolet light or deep-ultraviolet light.

20. A process according to claim 9 or 10 wherein when said active radiation is electron beam radiation, patterning is performed by scanning the electron beam radiation.

21. A process according to claim 9 or 10 wherein the deactivation treatment of the aromatic azide compound and/or the aromatic compound having a vinyl group within the solid film is effected by heating, vacuum processing or a combination thereof.

* * * * *